(12) United States Patent
Rogovin

(10) Patent No.: US 7,024,320 B2
(45) Date of Patent: Apr. 4, 2006

(54) METHOD AND SYSTEM FOR DETERMINING THE POSITION OF A SHORT CIRCUIT IN A BRANCHED WIRING SYSTEM

(75) Inventor: Daniel N. Rogovin, Newbury Park, CA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 10/902,522

(22) Filed: Jul. 29, 2004

(65) Prior Publication Data

US 2006/0025942 A1   Feb. 2, 2006

(51) Int. Cl.
  G01R 31/00  (2006.01)
  G01R 23/16  (2006.01)
  G01R 31/08  (2006.01)
(52) U.S. Cl. .................... 702/59; 702/76; 324/525
(58) Field of Classification Search ............... 702/59, 702/76; 324/525
  See application file for complete search history.

(56) References Cited

U.S. PATENT DOCUMENTS 5,587,662 A * 12/1996 Kelley et al. ............... 324/713
6,442,493 B1 * 8/2002 Jurisch et al. ............... 702/59
6,794,879 B1 * 9/2004 Lawson et al. ............. 324/509

\* cited by examiner

Primary Examiner—Marc S. Hoff
Assistant Examiner—Manuel L Barbee
(74) Attorney, Agent, or Firm—Sonnenschein Nath & Rosenthal LLP

(57) ABSTRACT

Methods, systems, and articles of manufacture consistent with the present invention provide for determining the location of a short circuit in a branched wiring system. The distance from the short circuit to an impedance measurement point is determined based on a measured impedance of the branched wiring system. The branch in which the short circuit is located is then determined by identifying a calculated high-frequency impedance phase spectrum for the branched wiring system with one of the branches short-circuited that correlates to a measured high-frequency impedance phase spectrum for the branched wiring system. The measured high-frequency impedance phase spectrum is measured from the impedance measurement point.

15 Claims, 17 Drawing Sheets

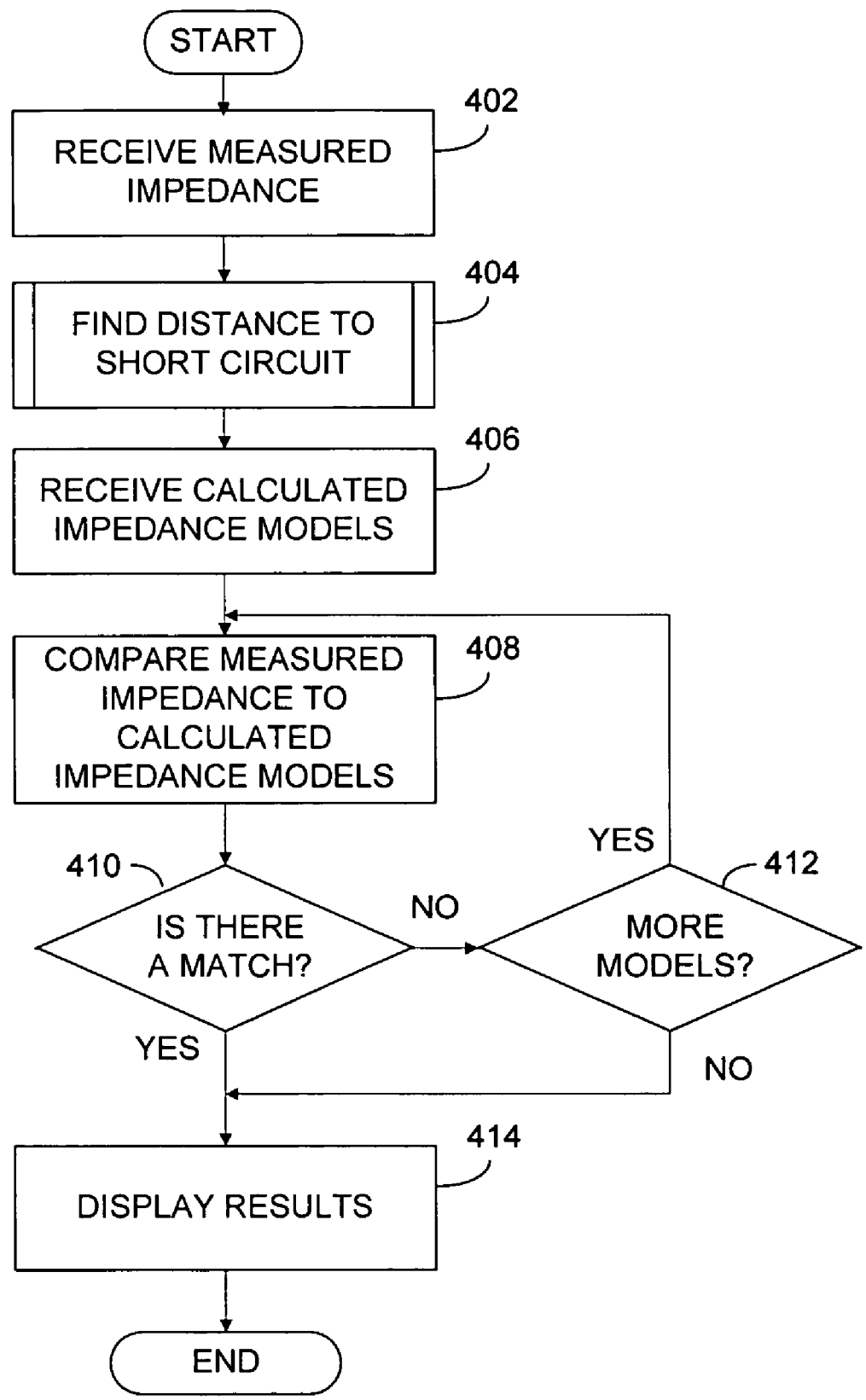

MEASURED HIGH-FREQUENCY IMPEDANCE PHASE SPECTRUM

LOG (FREQUENCY) (RADIANS)

MEASURED HIGH-FREQUENCY IMPEDANCE MAGNITUDE SPECTRUM

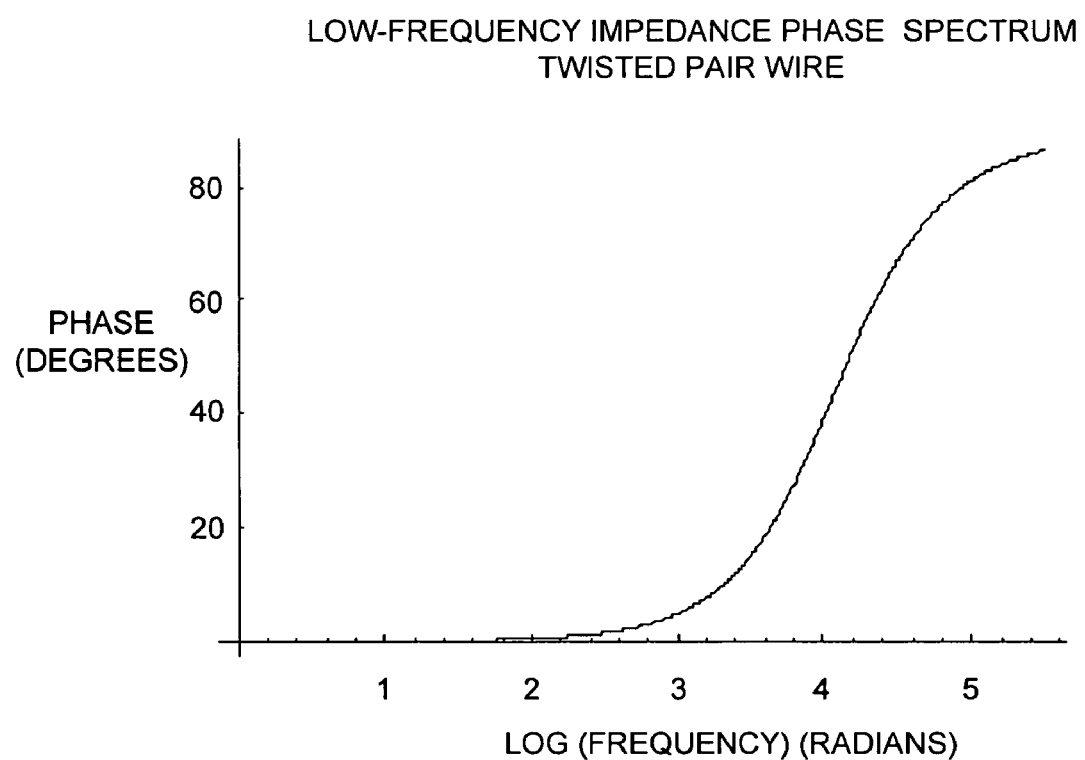

LOW-FREQUENCY IMPEDANCE PHASE SPECTRUM
TWISTED PAIR WIRE WITH TWO BRANCHES

HIGH-FREQUENCY IMPEDANCE PHASE SPECTRUM
TWISTED PAIR WIRE WITH TWO ADDITIONAL BRANCHES

CALCULATED HIGH-FREQUENCY IMPEDANCE PHASE SPECTRUM
BRANCH 102 SHORT-CIRCUITED

CALCULATED HIGH-FREQUENCY IMPEDANCE PHASE SPECTRUM
BRANCH 104 SHORT-CIRCUITED

CALCULATED HIGH-FREQUENCY IMPEDANCE PHASE SPECTRUM
BRANCH 108 SHORT-CIRCUITED

LOG (FREQUENCY) (RADIANS)

METHOD AND SYSTEM FOR DETERMINING THE POSITION OF A SHORT CIRCUIT IN A BRANCHED WIRING SYSTEM

GOVERNMENT CONTRACT

This invention was made with Government support under Contract No. DTFA-03-C-00014 awarded by the FAA. The Government has certain rights in this invention.

BACKGROUND OF THE INVENTION

The present invention generally relates to the field of electrical wire testing and, more particularly, to methods and systems for determining the position of a short circuit in a branched wire system.

Aged wiring can lead to detrimental conditions, such as short circuits. When the aged wiring is located in, for example, commercial or military aircraft, space vehicles, or nuclear power plants, the aged wiring can lead to serious consequences.

Although conventional methods and systems can locate wire shorts in simple wiring systems, those conventional methods and systems cannot locate wire shorts in branched wiring systems without measuring data for each individual branch of the wiring system. For purposes of this disclosure, a branched wiring system comprises at least three wires that are electrically coupled at a node. Each wire group (e.g., a twisted-pair wire) that is electrically coupled at the node is referred to as a branch herein. As branched wiring systems can have many branches, the testing of each branch of a branched wiring systems using conventional methods and systems requires significant time and costs. Further, the testing itself can break or damage the wires merely by connecting the wires to the testing device. There, thus, is a risk of damaging each branch of the wiring system when it is tested.

SUMMARY OF THE INVENTION

Methods, systems, and articles of manufacture consistent with the present invention locate a short circuit in a branched wiring system from a single measurement point and independently of the number of branches in the branched wiring system.

In accordance with methods consistent with the present invention, a method in a data processing system having a program for determining the position of a short circuit in a branched wiring system having at least two branches electrically coupled at a node is provided. The method comprises the steps of: determining the distance from the short circuit to an impedance measurement point based on a measured impedance of the branched wiring system; and determining in which branch the short circuit is located by identifying a calculated high-frequency impedance phase spectrum for the branched wiring system with one of the branches short-circuited that correlates to a measured high-frequency impedance phase spectrum for the branched wiring system, the measured high-frequency impedance phase spectrum is measured from the impedance measurement point.

In accordance with articles of manufacture consistent with the present invention, a computer-readable medium containing instructions that cause a data processing system having a program to perform a method for determining the position of a short circuit in a branched wiring system having at least two branches electrically coupled at a node is provided. The method comprises the steps of: determining the distance from the short circuit to an impedance measurement point based on a measured impedance of the branched wiring system; and determining in which branch the short circuit is located by identifying a calculated high-frequency impedance phase spectrum for the branched wiring system with one of the branches short-circuited that correlates to a measured high-frequency impedance phase spectrum for the branched wiring system, the measured high-frequency impedance phase spectrum is measured from the impedance measurement point.

In accordance with systems consistent with the present invention, a data processing system for determining the position of a short circuit in a branched wiring system having at least two branches electrically coupled at a node is provided. The data processing system comprises: a memory comprising a program that determines the distance from the short circuit to an impedance measurement point based on a measured impedance of the branched wiring system, and determines in which branch the short circuit is located by identifying a calculated high-frequency impedance phase spectrum for the branched wiring system with one of the branches short-circuited that correlates to a measured high-frequency impedance phase spectrum for the branched wiring system, the measured high-frequency impedance phase spectrum is measured from the impedance measurement point; and a processing unit that runs the program.

In accordance with systems consistent with the present invention, a data processing system for determining the position of a short circuit in a branched wiring system having at least two branches electrically coupled at a node is provided. The data processing system comprises: means for determining the distance from the short circuit to an impedance measurement point based on a measured impedance of the branched wiring system; and means for determining in which branch the short circuit is located by identifying a calculated high-frequency impedance phase spectrum for the branched wiring system with one of the branches short-circuited that correlates to a measured high-frequency impedance phase spectrum for the branched wiring system, the measured high-frequency impedance phase spectrum is measured from the impedance measurement point.

Other features of the invention will become apparent to one with skill in the art upon examination of the following figures and detailed description. It is intended that all such additional systems, methods, features, and advantages be included within this description, be within the scope of the invention, and be protected by the accompanying claims.

BRIEF DESCRIPTION OF THE DRAWINGS

FIG. 4 is a flow diagram of the exemplary steps for locating a short circuit in a branched wiring system consistent with the present invention;

FIG. 7A is a low-frequency phase spectrum of a twisted-pair wire;

Corresponding reference characters indicate corresponding parts throughout the several views of the drawings.

DETAILED DESCRIPTION OF THE INVENTION

Reference will now be made in detail to an implementation in accordance with methods, systems, and articles of manufacture consistent with the present invention as illustrated in the accompanying drawings.

Methods, systems, and articles of manufacture consistent with the present invention locate a short circuit in a branched wiring system from a single measurement point and independently of the number of branches.

Figure 1:
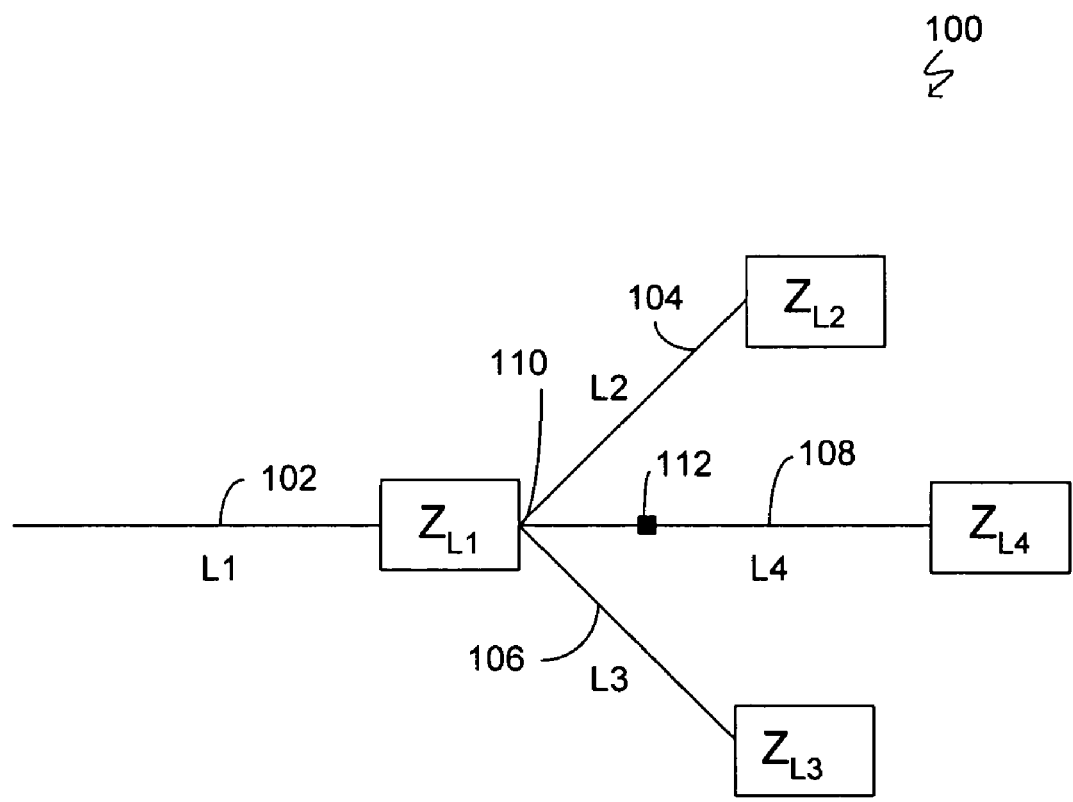
FIG. 1 is a schematic diagram of an illustrative example of a branched wiring system.

FIG. 1 depicts an illustrative example of a simple branched wiring system 100. As shown, branched wiring system 100 comprises four branches, namely branch 102, branch 104, branch 106, and branch 108. The branches are electrically coupled at a node 110. Each branch consists of a similar wire type, such coaxial cable or twisted-pair wire, with the corresponding leads of each branch being electrically coupled to one another at node 110. To effect the electrical coupling at the node, a suitable electrical connection is used, such as an electrical connector or a solder joint.

As can be appreciated, the illustrative branched wiring system 100 shown in FIG. 1 is a simple system. However, the branched wiring system 100 can be more complex and include additional elements, such as additional branches electrically coupled to any of the branches, and can include load elements, such as motors, electrically coupled to one or more of the branches. Each branch is illustratively shown as having a length Lx and an impedance $Z_{Lx}$, where x represents the respective branch. As shown in FIG. 1, branch 102 has a length L1 and an impedance $Z_{L1}$, branch 104 has a length L2 and an impedance $Z_{L2}$, branch 106 has a length L3 and an impedance $Z_{L3}$, and branch 108 has a length L4 and an impedance $Z_{L4}$. The impedances represent the impedance of the wire itself, as well as additional load elements electrically coupled to the wire, such as additional wiring (e.g., additional branches) and other types of load elements, such as motors.

As shown in FIG. 1, there is a short circuit 112 in branch 108. Using conventional methods and systems to find the short circuit would require taking measurements for each individual branch. In other words, one would have to measure and test, for example, branch 102, then branch 104, and so on, until the short circuit was located. That conventional approach can take a long time if there are a large number of branches. Further, each time the test equipment is connected to the wires of the various branches, there is a risk of damaging the wires.

Figure 2:
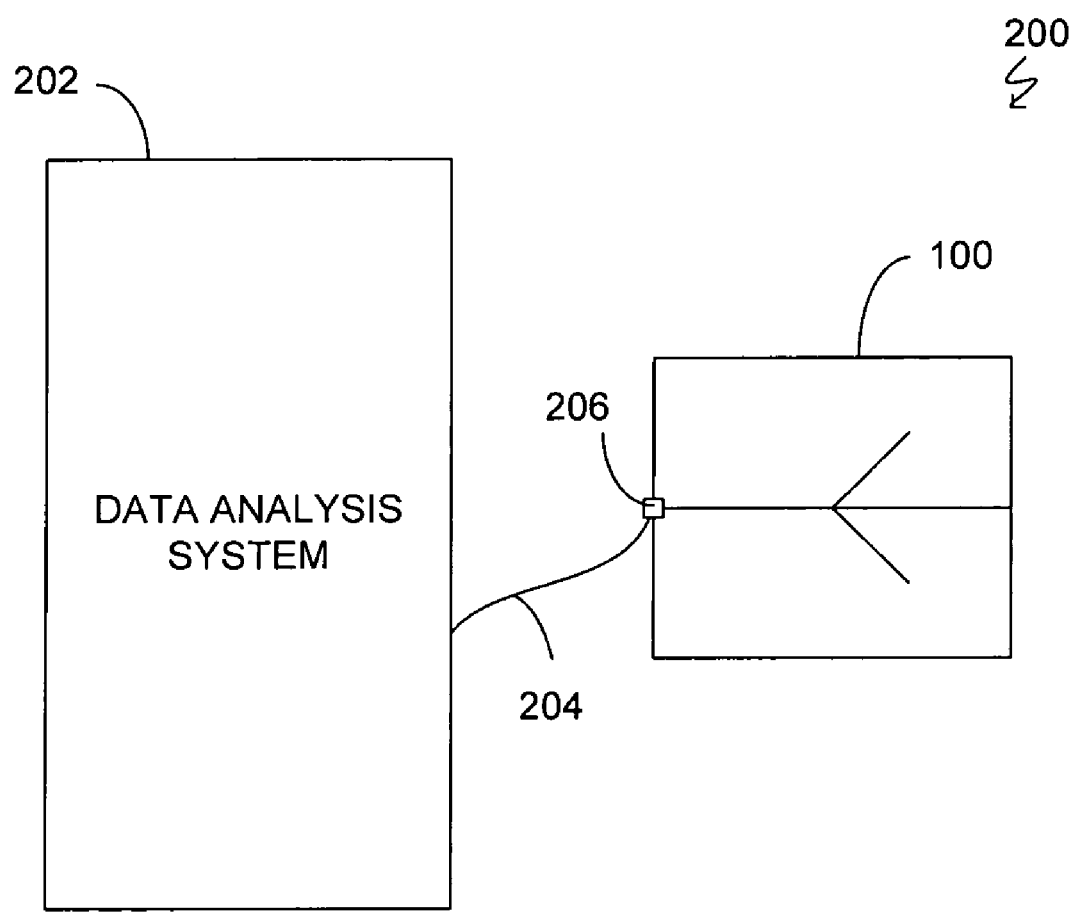
FIG. 2 is a schematic diagram of a system for locating a short circuit in a branched wiring system consistent with the present invention.

FIG. 2 depicts a schematic diagram of a system 200 for locating a short circuit in a branched wiring system consistent with the present invention. As illustrated, the system 200 generally comprises the branched wiring system 100, which contains the short circuit. A data analysis system 202 is connected to a measurement point of the branched wiring system 100 via a cable 204. Cable 204 electrically couples to the branched wiring system 100 via a connector 206, such as a banana clip or other conventional connector. Data analysis system 202 measures the impedance of the branched wiring system, determines whether there is a short circuit in the branched wiring system, and locates the short circuit based on the measured impedance. Further, data analysis system 202 determines the position of a short circuit at any point in the branched wiring system by measuring the impedance from the single measurement point.

Figure 3:
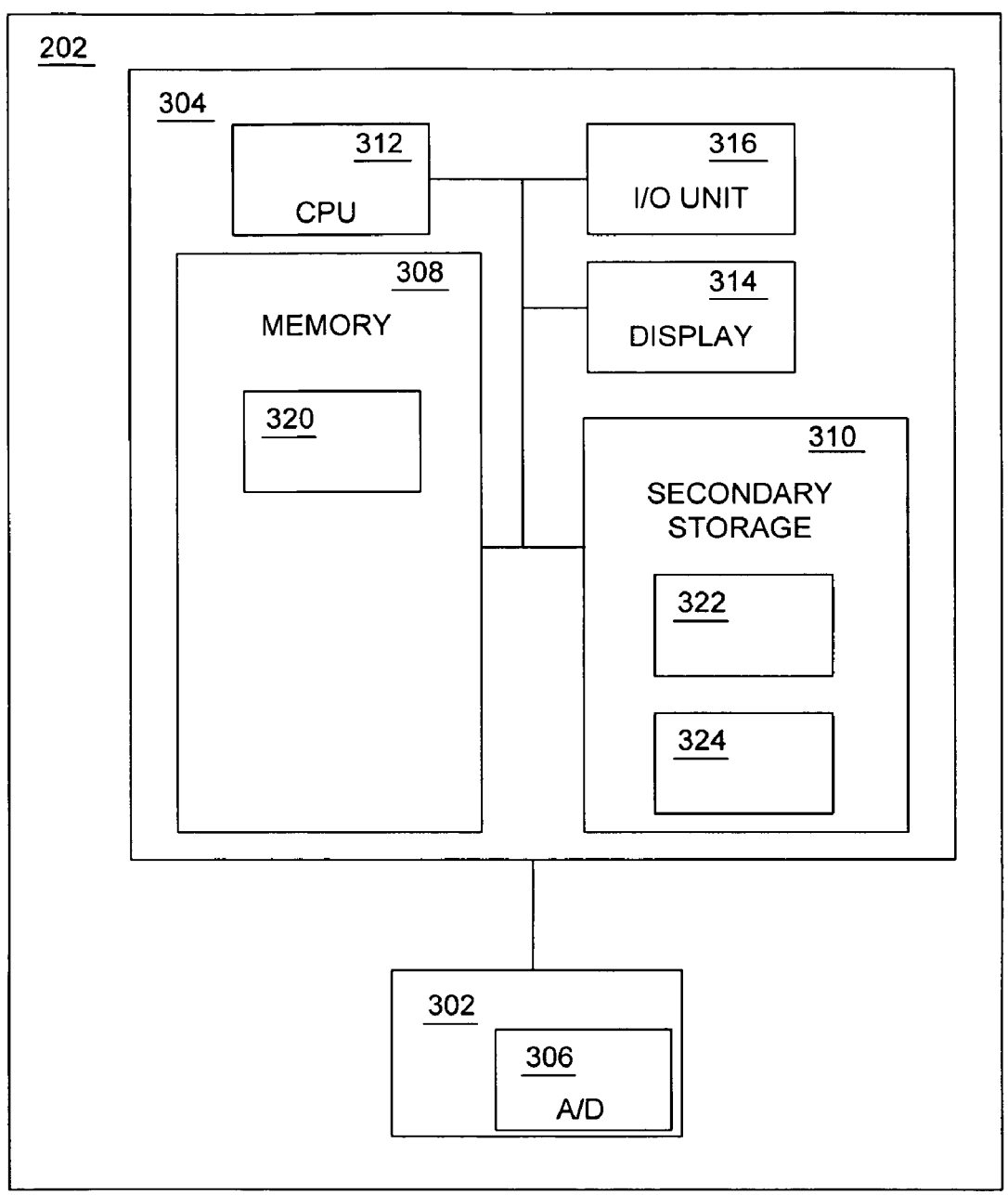
FIG. 3 is a block diagram of a data analysis system consistent with the present invention.

FIG. 3 depicts a data analysis system 202 suitable for use with methods and systems consistent with the present invention. Data analysis system 202 comprises an impedance measurement device 302 and a data processing system 304. Impedance measurement device 302 measures the magnitude and phase of the broadband input impedance of the branched wiring system 100, and can be a suitable off-the-shelf impedance measurement device. For example, the impedance measurement device can be, but is not limited to, the 4294A Precision Impedance Analyzer manufactured by Agilent Technologies, Inc. of Palo Alto, Calif., U.S.A. As impedance measurement devices are known to one having skill in the art, the impedance measurement device will not be described in further detail.

During operation, the impedance measurement device outputs an output signal, which is transmitted through the branched wiring system via cable 204. The frequency of the output signal is adjusted so that the impedance measurement device 302 measures the frequency-dependant impedance of the branched wiring system 100 across a broad range of frequencies. The measured impedance is converted to a digital signal by an analog-to-digital converter 306 and output from the impedance measurement device. Once the signal is in a digital form, it can be processed by data processing system 304. Collected impedance data may be archived in a memory 308 or a secondary storage 310 of data processing system 304.

One having skill in the art will appreciate that the data acquisition and data collection functionality of data analysis system 202 can be included in a device separate from data processing system 304. The separate device would comprise an impedance measurement system having an analog-to-digital converter, a processing unit, and a memory. The collected raw data would be stored on the separate device during data acquisition and can then be transferred to the data processing system 304 for processing.

Data processing system 304 comprises a central processing unit (CPU) 312, a display device 314, an input/output (I/O) unit 316, secondary storage device 310, and memory 308. The data processing system may further comprise standard input devices such as a keyboard, a mouse or a speech processing means (each not illustrated).

Memory 308 comprises a program 320 for determining the position of a short circuit in a branched wiring system. In an illustrative example, program 320 is implemented using MATLAB® software, however, the program can be implemented using another application programming or another programming language. As will be described in more detail below, the program determines the distance from the measurement point to the short circuit, and then identifies which branch contains the short circuit by comparing the measured frequency-dependent impedance phase spectrum of the branched wiring system to modeled frequency-dependent impedance phase spectrums of the branched wiring system, in which one of the braches is short circuited in each model. MATLAB is a United States registered trademark of The MathWorks, Inc. of Natwick, Mass.

One having skill in the art will appreciate that the program can reside in memory on a system other than data processing system 304. Program 320 may comprise or may be included in one or more code sections containing instructions for performing their respective operations. While program 320 is described as being implemented as software, the present implementation may be implemented as a combination of hardware and software or hardware alone. Also, one having skill in the art will appreciate that program 320 may comprise or may be included in a data processing device, which may be a client or a server, communicating with data processing system 304. Further, data analysis system 202 can itself be an impedance measurement device.

Although aspects of methods, systems, and articles of manufacture consistent with the present invention are depicted as being stored in memory, one having skill in the art will appreciate that these aspects may be stored on or read from other computer-readable media, such as: secondary storage devices, like hard disks, floppy disks, and CD-ROM; a carrier wave received from a network such as the Internet; or other forms of ROM or RAM either currently known or later developed. Further, although specific components of data processing system 304 have been described, one having skill in the art will appreciate that a data processing system suitable for use with methods, systems, and articles of manufacture consistent with the present invention may contain additional or different components.

Data processing system 304 can itself also be implemented as a client-server data processing system. In that case, program 320 can be stored on the data processing system as a client, while some or all of the steps of the processing described below can be carried out on a remote server, which is accessed by the client over a network. The remote server can comprise components similar to those described above with respect to the data processing system, such as a CPU, an I/O, a memory, a secondary storage, and/or a display device.

Figure 5A:
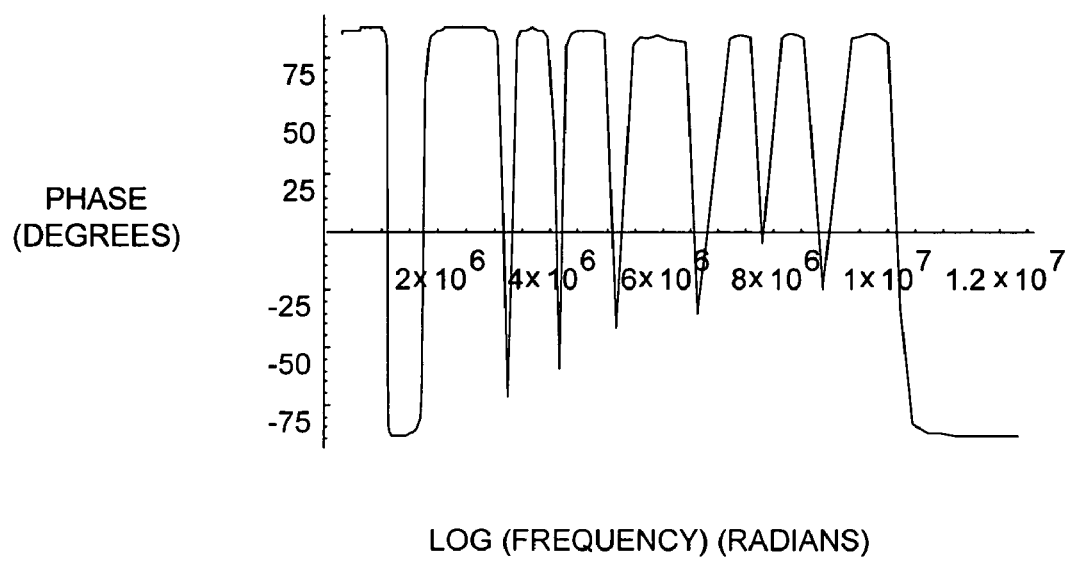
FIG. 5A is a measured high-frequency phase spectrum of the branched wiring system of FIG. 1.
Figure 5B:
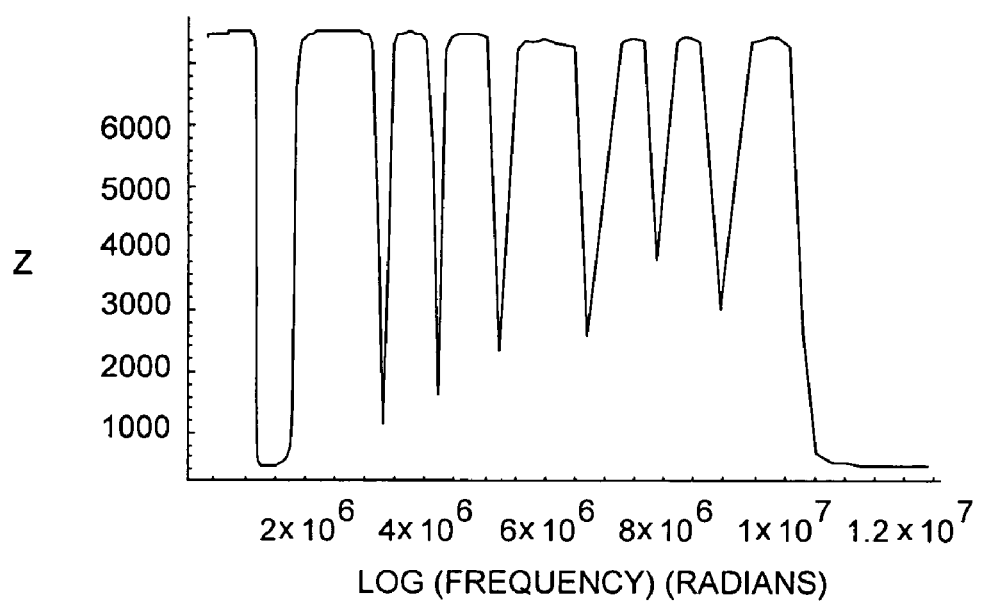
FIG. 5B is a measured high-frequency magnitude spectrum of the branched wiring system of FIG. 1.

FIG. 4 depicts a flow diagram illustrating the exemplary steps performed by program 320. First, the program receives the measured impedance for the branched wiring system (step 402). The measured impedance can be received, for example, as a data file in the memory or in the secondary storage. Alternatively, the program can measure the measured impedance over a predetermined range of frequencies and store the frequency-dependent impedance magnitude and phase spectra, for example, in the memory or the secondary storage. In the illustrative example, the impedance measurement device measures the frequency-dependent impedance magnitude and phase spectra and transfers the spectra to the data processing system, where the spectra are saved in a measured-data data file 324 in the secondary storage. The data for the measured high-frequency impedance phase spectrum for the illustrative example, wherein branch 108 is shorted, is shown in FIG. 5A. The data for the measured high-frequency impedance magnitude spectrum for the illustrative example, in which branch 108 is shorted, is shown in FIG. 5B.

Figure 6:
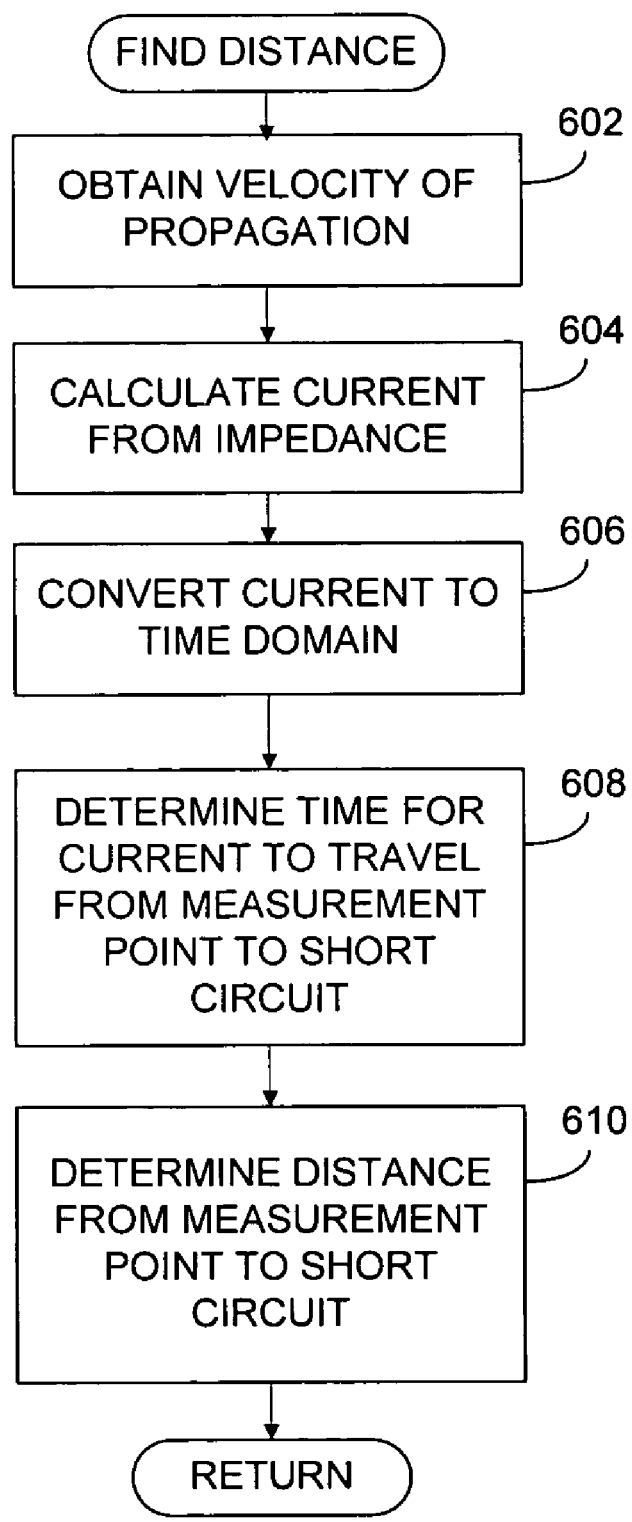
FIG. 6 is a flow diagram of the exemplary steps for determining the distance of a short circuit from an impedance measurement point consistent with the present invention.

Then, the program determines the distance from the measurement point to the short circuit (step 404). The processing of step 404 is shown in more detail in FIG. 6. The wiring of the branched wiring system has a known velocity of propagation, therefore it is known how fast a signal travels through the branched wiring system. Referring to FIG. 6, the program obtains the velocity of propagation (step 602). This can be done, for example, by reading the velocity of propagation from a data file stored on the secondary storage. Alternatively, the program can obtain the velocity, for example, by receiving the velocity from a user's input. The program then calculates the inverse of the measured impedance $Z(\omega)$, which yields the signal's current of the signal in the frequency domain as shown below in Equation (1) (step 604).

$$i(\omega)=1/Z(\omega) \qquad \text{Equation (1).}$$

Having calculated the signal's current in the frequency domain, the program then calculates the inverse Fourier transform of the current ($i(\omega)$), which yields the current in the time domain, that is, $i(t)$ (step 606). Looking at the current in the time domain, the program identifies the point in time at which the measured current exhibits a short-circuit condition, that is, when the measured current approaches infinity (step 608). That point in time also identifies how long it takes for the current to travel from the measurement point to the short circuit.

Knowing the velocity of the current and the time it takes for the current to travel from the measurement point to the short circuit, the program can then determine the distance from the measurement point to the short circuit as shown below in Equation (2) (step 610).

$$d_{measurement\ point\ to\ short\ circuit} = velocity_{current} \times time_{measurement\ point\ to\ short\ circuit} \qquad \text{Equation (2).}$$

Referring to the illustrative example of FIG. 1, if the current velocity is $2.4 \times 10^8$ meters/second and it takes the current $2.5 \times 10^{-9}$ seconds to travel from the of the measurement point to the short circuit, then the distance to the short circuit is calculated as shown below in Equation (3).

$$d_{measurement\ point\ to\ short\ circuit} = (2.4 \times 10^8 \text{ m/s}) \times (2.5 \times 10^{-9} \text{ s}) = 6 \text{ m} \qquad \text{Equation (3).}$$

Referring back to FIG. 4, having determined the distance of the short circuit from the measurement point in step 404, the program then determines in which branch the short circuit is located. For example, although it is known that the short circuit is six meters from the measurement point in the illustrative example, that distance could place the short circuit in more than one potential branch. To determine the correct branch, the program receives models of the frequency-dependant impedance of the branched wiring system 100, wherein in each model a different branch is short-circuited (step 406). Referring to the illustrative example of FIG. 1, the program receives four models, wherein one of the branches (i.e., branch 102, 104, 106 or 108) is short-circuited in each model. Each model is created and provided by a user and comprises a data set of the calculated frequency-dependent impedance phase spectrum for the model. As will be described in more detail below, the program compares the data values for the models to the data values for the measured impedance across the range of frequencies to find a match. The calculations for determining the frequency-dependant impedance of a circuit are known in the art and thus will not be described in detail herein.

To create the models for the branched wiring system of FIG. 1, the user starts by calculating the frequency-dependant impedance $Z(\omega)$ of the branched wiring system in which none of the branches are short-circuited (i.e., a healthy circuit). The impedance Z of the branched wiring system of FIG. 1 is modeled as shown below in Equation (4):

impedance $Z_{L1}$, branch 104 has length L2 and impedance $Z_{L2}$, branch 106 has length L3 and impedance $Z_{L3}$, and branch 108 has length L4 and impedance $Z_{L4}$.

Figure 7B:
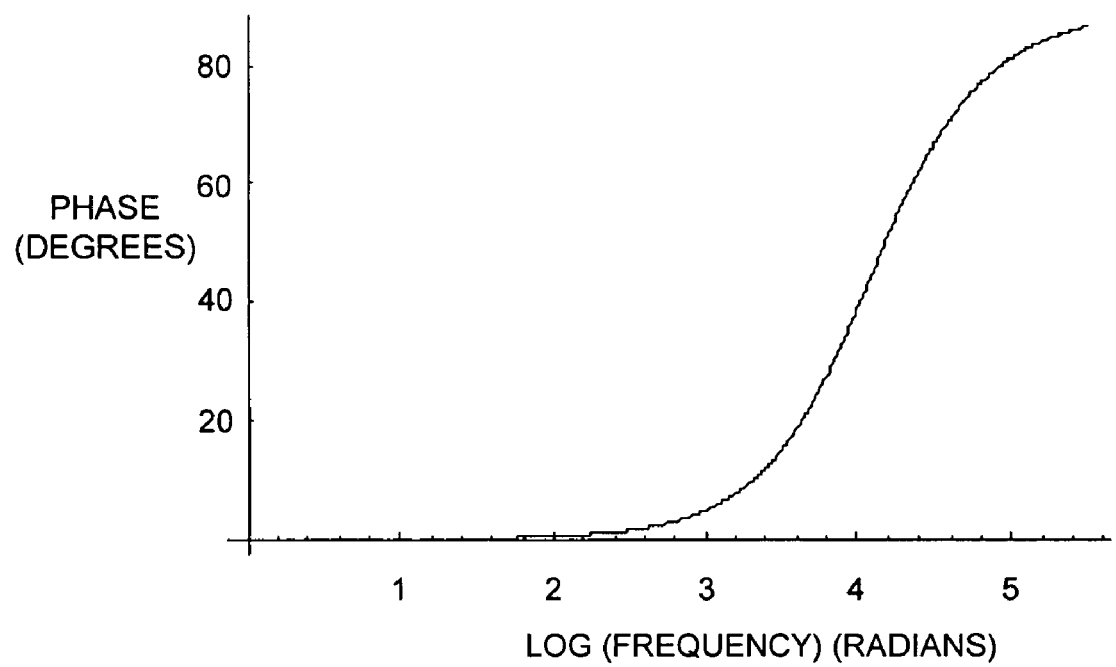
FIG. 7B is a low-frequency phase spectrum of a twisted-pair wire having two additional branches.
Figure 7C:
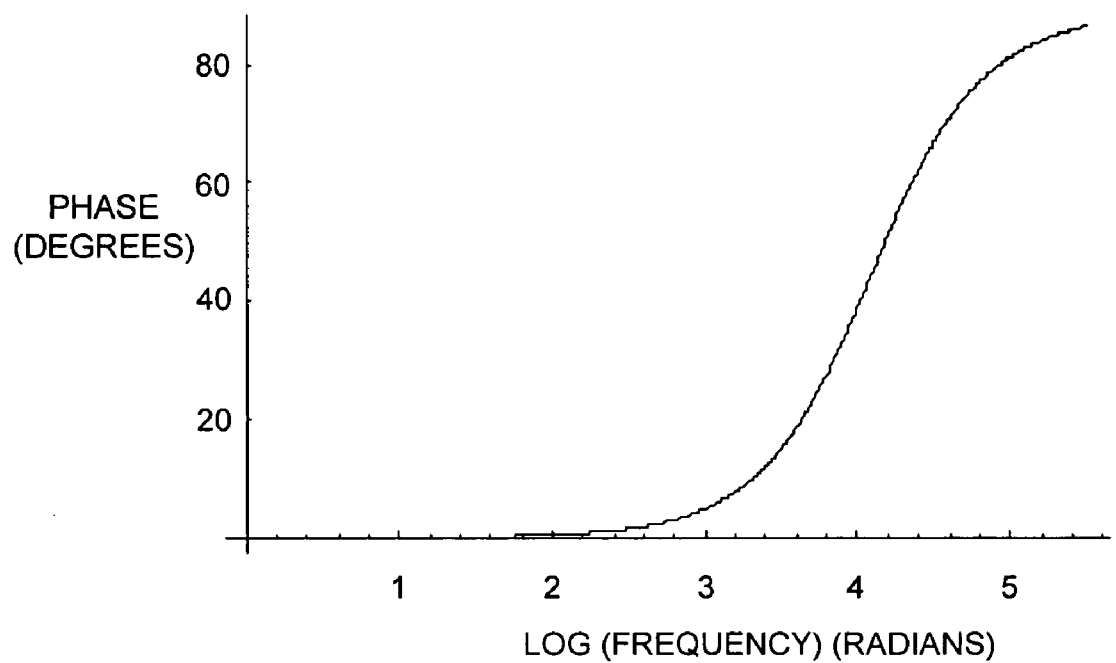
FIG. 7C is a low-frequency phase spectrum of a twisted-pair wire having three additional branches.
Figure 8A:
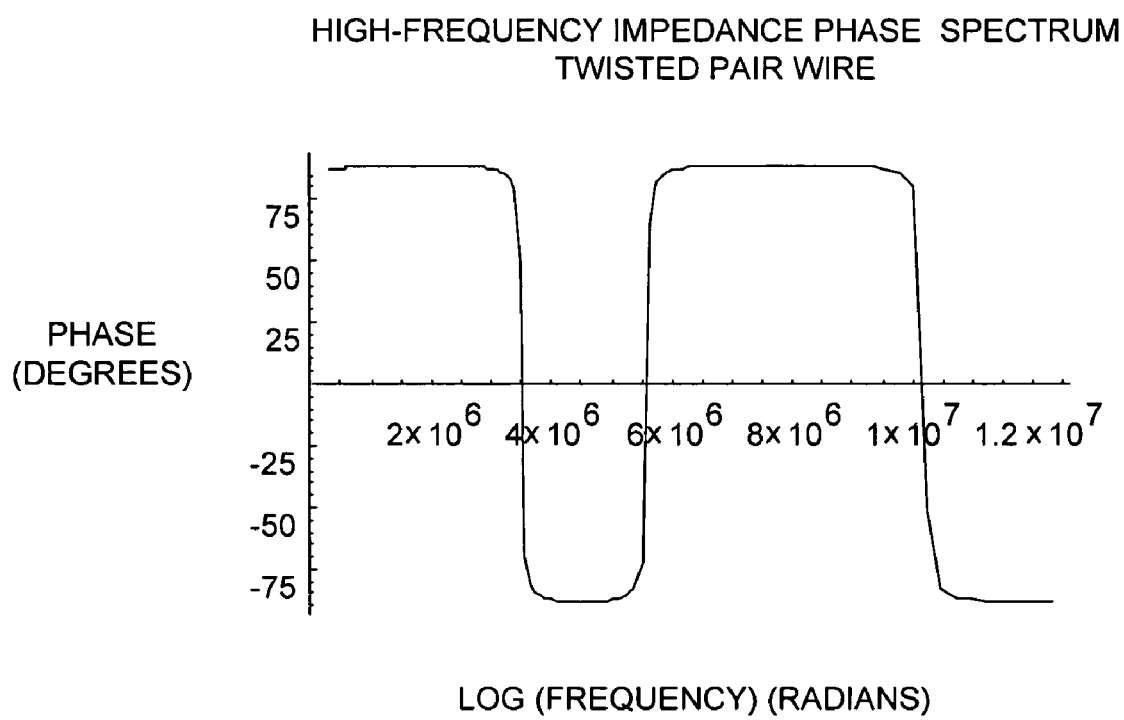
FIG. 8A is a high-frequency phase spectrum of the twisted-pair wire of FIG. 5A.
Figure 8B:
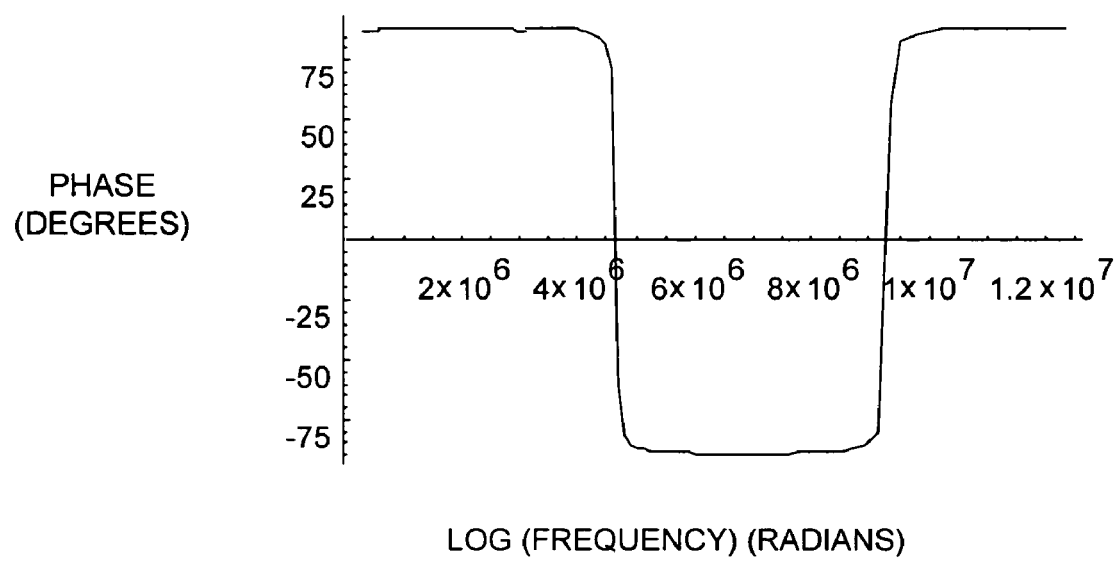
FIG. 8B is a high-frequency phase spectrum of the twisted-pair wire having two additional branches of FIG. 5B.
Figure 8C:
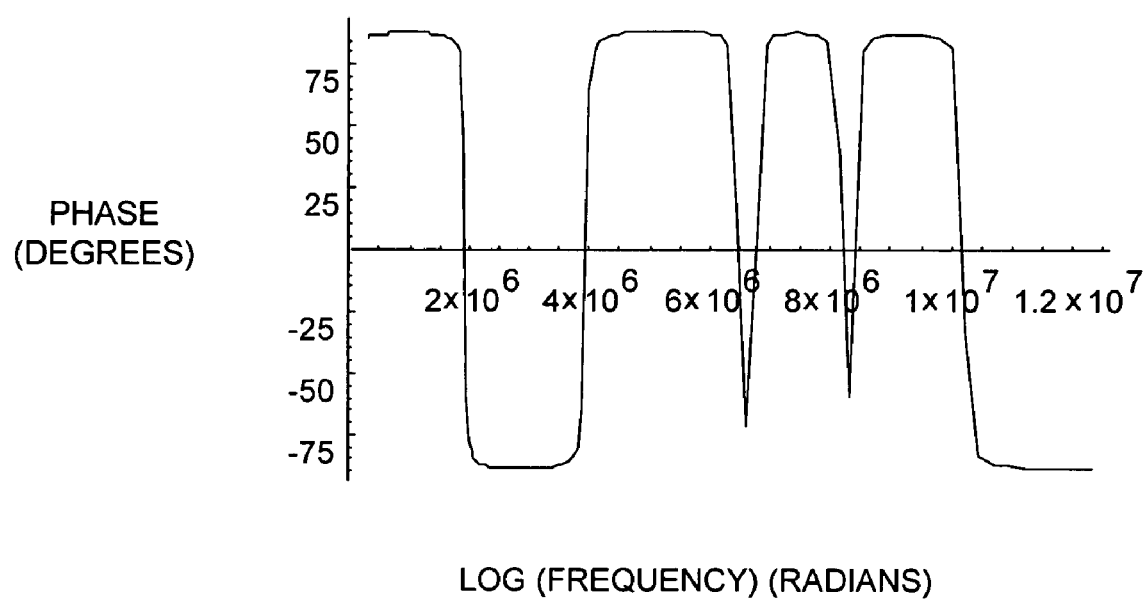
FIG. 8C depicts a high-frequency phase spectrum of the twisted-pair wire having three additional branches of FIG. 5C.

Through experimentation, the inventor has determined that the broadband impedance of branched wiring systems varies when the branched wiring system is modified. As the examples of FIGS. 7A–7C illustrate, the low-frequency impedance phase spectra of a twisted-pair wire (FIG. 7A), a twisted-pair wire having two additional branches (FIG. 7B), and a twisted-pair wire having three additional branches (FIG. 7C) are the same. However, as shown in FIGS. 8A–8C, their high-frequency impedance phase spectra become increasingly complex as the wiring systems become more complex. Further, just as the twisted-pair wire having additional branches has a distinct high-frequency impedance phase spectrum signature, this wire also exhibits different Equation (4): $Z = A / B$, where $$A = Z0 \left\{ e^{g/L0} + \frac{ e^{g/L0} \left( -\frac{e^{-g/L1}}{Z01} - \frac{e^{-g/L1}\left(e^{-g2L1} + \frac{e^{g2L1-2g2L2}(Z02-ZL2)}{Z02+ZL2}\right)}{Z02\left(-e^{-g2L1} + \frac{e^{g2L1-2g2L2}(Z02-ZL2)}{Z02+ZL2}\right)} - \frac{e^{-g/L1}\left(e^{-g3L1} + \frac{e^{g3L1-2g3L3}(Z03-ZL3)}{Z03+ZL3}\right)}{Z03\left(-e^{-g3L1} + \frac{e^{g3L1-2g3L3}(Z03-ZL3)}{Z03+ZL3}\right)} - \frac{e^{-g/L1}\left(e^{-g4L1} + \frac{e^{g4L1-2g4L4}(Z04-ZL4)}{Z04+ZL4}\right)}{Z04\left(-e^{-g4L1} + \frac{e^{g4L1-2g4L4}(Z04-ZL4)}{Z04+ZL4}\right)} \right) }{ \left( -\frac{e^{-g/L1}}{Z01} + \frac{e^{g/L1}\left(e^{-g2L1} + \frac{e^{g2L1-2g2L2}(Z02-ZL2)}{Z02+ZL2}\right)}{Z02\left(-e^{-g2L1} + \frac{e^{g2L1-2g2L2}(Z02-ZL2)}{Z02+ZL2}\right)} + \frac{e^{g/L1}\left(e^{-g3L1} + \frac{e^{g3L1-2g3L3}(Z03-ZL3)}{Z03+ZL3}\right)}{Z03\left(-e^{-g3L1} + \frac{e^{g3L1-2g3L3}(Z03-ZL3)}{Z03+ZL3}\right)} + \frac{e^{g/L1}\left(e^{-g4L1} + \frac{e^{g4L1-2g4L4}(Z04-ZL4)}{Z04+ZL4}\right)}{Z04\left(-e^{-g4L1} + \frac{e^{g4L1-2g4L4}(Z04-ZL4)}{Z04+ZL4}\right)} \right) } \right\}$$

$$B = e^{g/L0} - \frac{ e^{g/L0} \left( -\frac{e^{-g/L1}}{Z01} - \frac{e^{-g/L1}\left(e^{-g2L1} + \frac{e^{g2L1-2g2L2}(Z02-ZL2)}{Z02+ZL2}\right)}{Z02\left(-e^{-g2L1} + \frac{e^{g2L1-2g2L2}(Z02-ZL2)}{Z02+ZL2}\right)} - \frac{e^{-g/L1}\left(e^{-g3L1} + \frac{e^{g3L1-2g3L3}(Z03-ZL3)}{Z03+ZL3}\right)}{Z03\left(-e^{-g3L1} + \frac{e^{g3L1-2g3L3}(Z03-ZL3)}{Z03+ZL3}\right)} - \frac{e^{-g/L1}\left(e^{-g4L1} + \frac{e^{g4L1-2g4L4}(Z04-ZL4)}{Z04+ZL4}\right)}{Z04\left(-e^{-g4L1} + \frac{e^{g4L1-2g4L4}(Z04-ZL4)}{Z04+ZL4}\right)} \right) }{ \left( -\frac{e^{-g/L1}}{Z01} + \frac{e^{g/L1}\left(e^{-g2L1} + \frac{e^{g2L1-2g2L2}(Z02-ZL2)}{Z02+ZL2}\right)}{Z02\left(-e^{-g2L1} + \frac{e^{g2L1-2g2L2}(Z02-ZL2)}{Z02+ZL2}\right)} + \frac{e^{g/L1}\left(e^{-g3L1} + \frac{e^{g3L1-2g3L3}(Z03-ZL3)}{Z03+ZL3}\right)}{Z03\left(-e^{-g3L1} + \frac{e^{g3L1-2g3L3}(Z03-ZL3)}{Z03+ZL3}\right)} + \frac{e^{g/L1}\left(e^{-g4L1} + \frac{e^{g4L1-2g4L4}(Z04-ZL4)}{Z04+ZL4}\right)}{Z04\left(-e^{-g4L1} + \frac{e^{g4L1-2g4L4}(Z04-ZL4)}{Z04+ZL4}\right)} \right) }$$

In Equation (4), $Z_o$ represents the characteristic impedance of the branched wiring system, $Z_{ox}$ represents the characteristic impedance of a branch x, $Z_{Lx}$ represents the impedance of a branch x, gx represents the propagation function of a branch x, and Lx represents the length of a branch x. As described above, branch 102 has length L1 and high-frequency impedance phase spectrum signatures when its branches are individually short-circuited.

Referring back to the illustrative example of FIG. 1, knowing the impedance of the branched wiring system, the user calculates the broadband impedance for the branched wiring system. As the broadband impedance includes a magnitude and a phase, the calculation yields a frequency-dependent impedance magnitude spectrum and a frequency-dependent impedance phase spectrum. The low and high frequency impedance phase spectrums for the circuit in FIG. 1, with no short circuits, are respectively represented by FIGS. 7C and 8C.

Figure 9:
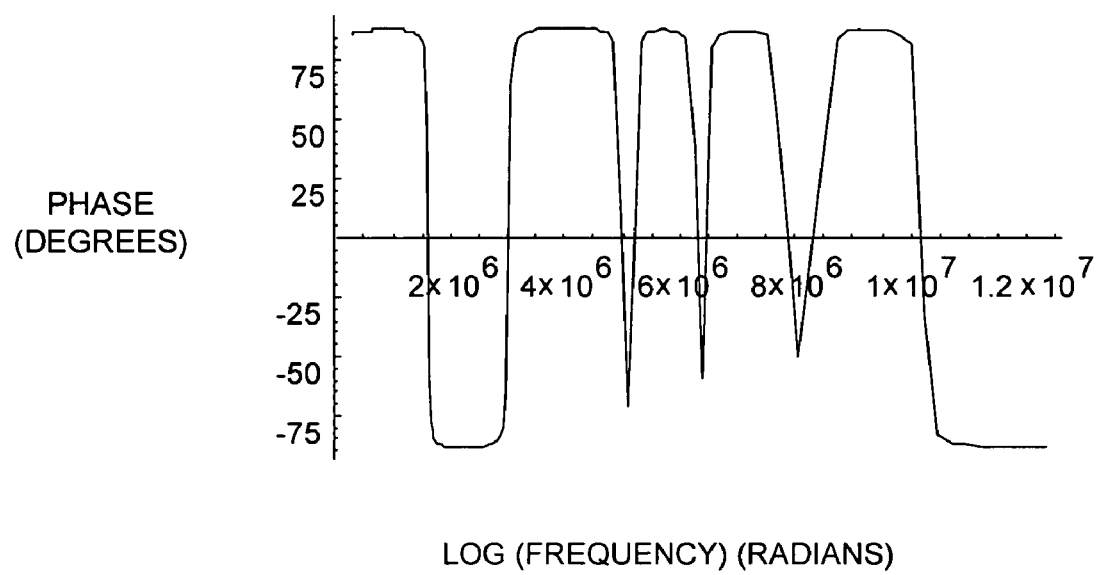
FIG. 9 is a calculated high-frequency phase spectrum of the branched wiring system of FIG. 1 with branch 102 short-circuited.

The user then proceeds to calculate models of the broadband impedances for the circuit of FIG. 1 in which the branches are individually short-circuited at the same distance from the measurement point as the short circuit distance determined in step 404. For example, starting with branch 102, the user models the impedance Z of the branched wiring system with branch 102 short-circuited at six meters from the measurement point. Then, the user calculates the broadband impedance $Z(\omega)$ of the model having branch 102 short circuited. The high-frequency impedance phase spectrum for the branched wiring system with branch 102 short-circuited is illustratively shown in FIG. 9.

Figure 10:
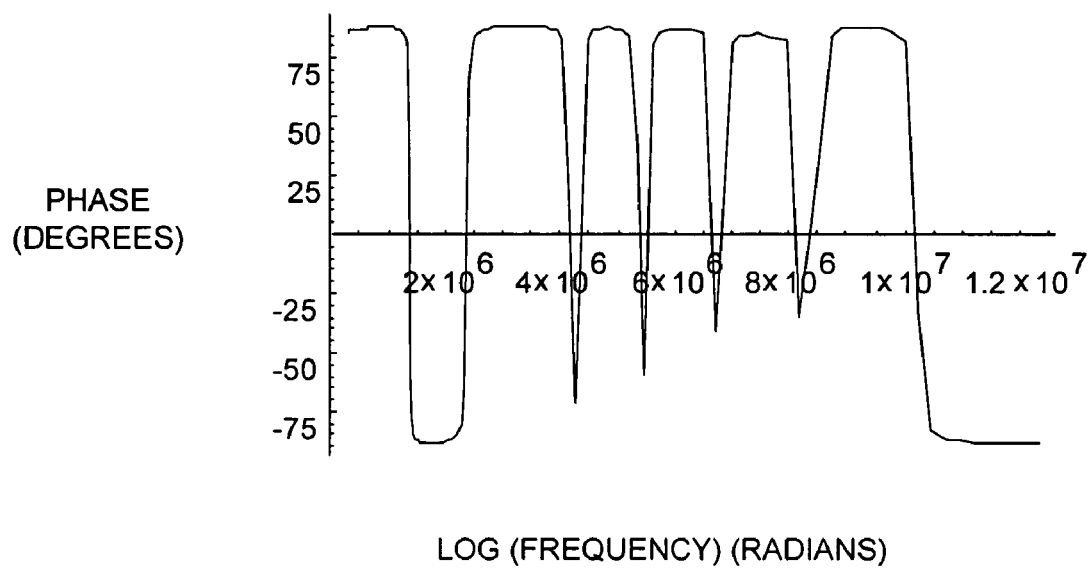
FIG. 10 is a calculated high-frequency phase spectrum of the branched wiring system of FIG. 1 with branch 104 short-circuited.
Figure 11:
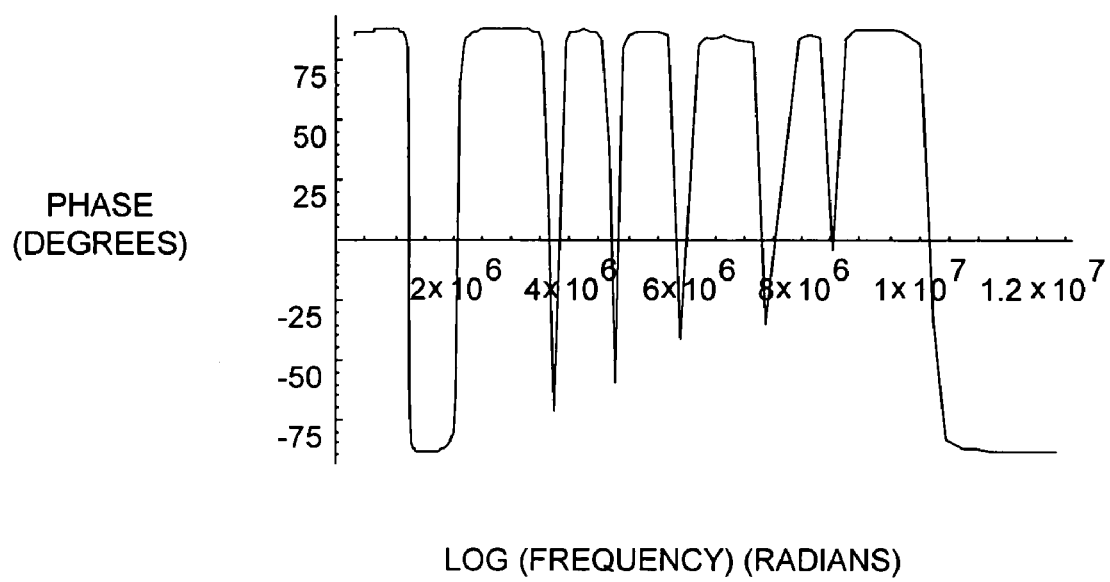
FIG. 11 is a calculated high-frequency phase spectrum of the branched wiring system of FIG. 1 with branch 106 short-circuited.
Figure 12:
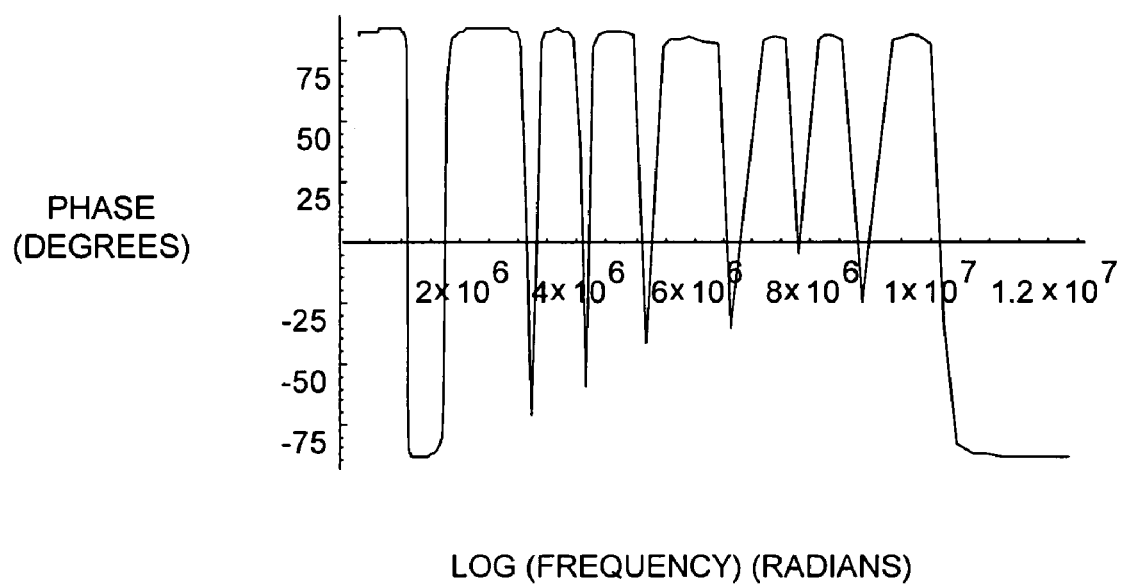
FIG. 12 is a calculated high-frequency phase spectrum of the branched wiring system of FIG. 1 with branch 108 short-circuited.

Then, the user creates additional models of the broadband impedances of the branched wiring system in which the remaining branches (i.e., branch 104, branch 106, and branch 108) are individually short-circuited. High-frequency impedance phase spectra for these additional models are depicted in FIGS. 10–12.

After the user calculates the impedance values as described above, the user provides the data for each calculated model to the data processing system. The data is provided in a form that is suitable for reading by the program. For example, the data can be stored in an array or other data structure, and can be stored, for example, in the memory or on the secondary storage. In the illustrative example, the user saves the data for each model in a model-data data file 322 on the secondary storage. The illustrative model-data data file comprises frequency values and corresponding calculated impedance phase values.

Then, the program compares the measured high-frequency impedance phase spectrum to the one of the modeled high-frequency impedance phase spectrums (step 408). To perform the comparison, the program compares the data in the measured-data data file to the data in the model-data data file. In the illustrative example, the program starts by comparing the model data for the branched wiring system with no short-circuited branches, however, the program can alternatively start with another model. The program can compare all of the data points of the measured data (i.e., all of the impedance phase data) or can alternatively perform a different comparison. For example, the program can look for zero crossings at common frequencies.

If the program determines that there is not a match (step 410), then the program determines whether there is an additional model to compare (step 412). If there is another model to compare, then the processing returns to step 408 to perform the comparison of the measured data to the next model data. For example, the program would compare the measured data to the model data for the branched wiring system with branch 104 short-circuited.

If the program determines in step 410 that there is a match or determines in step 412 that there are no additional models to compare, then the program displays the results of the analysis, for example, on the display device (step 414). The results include, for example, the identity of the short-circuited branch and the distance of the short circuit from the measurement point. In the illustrative example of FIG. 1, the program displays information that the short circuit is six meters from the measurement point and located in branch 108.

Therefore, methods, systems, and articles of manufacture consistent with the present invention provide a determination of the location of a short circuit in a branched wiring system. Further, the methods and systems consistent with the present invention provide beneficial improvements over conventional approaches, in that: a short circuit can be located in any branch from a single measurement point; as the impedance is measured from a single measurement point, there is a reduced risk of damaging the wire; and each branch does not need to be tested individually.

As an alternative to using the program to find the location of a short circuit, one having skill in the art will appreciate that the user can also identify a location of a short circuit by visually comparing either the graphical or numerical representations of the broadband impedance magnitude and phase spectra.

The foregoing description of an implementation of the invention has been presented for purposes of illustration and description. It is not exhaustive and does not limit the invention to the precise form disclosed. Modifications and variations are possible in light of the above teachings or may be acquired from practicing the invention. For example, the described implementation includes software but the present implementation may be implemented as a combination of hardware and software or hardware alone. Further, the illustrative processing steps performed by the program can be executed in an different order than described above, and additional processing steps can be incorporated. The invention may be implemented with both object-oriented and non-object-oriented programming systems. The scope of the invention is defined by the claims and their equivalents.

What is claimed is:

1. A method in a data processing system having a program for determining the position of a short circuit in a branched wiring system including at least two branches electrically coupled at a node, the method comprising:
   determining the distance from the short circuit to an impedance measurement point based on a measured impedance of the branched wiring system; and
   determining in which branch the short circuit is located by identifying a calculated high-frequency impedance phase spectrum for the branched wiring system with one of the branches short-circuited that correlates to a measured high-frequency impedance phase spectrum for the branched wiring system, wherein the measured high-frequency impedance phase spectrum is measured from the impedance measurement point.

2. A method according to claim 1 wherein the step of determining the distance from the short circuit to the impedance measurement point comprises:
   calculating a signal current based on the measured impedance;
   converting the signal current to the time domain;
   identifying a time at which the signal current exhibits a short-circuit condition; and
   calculating the distance from the short circuit to the impedance measurement point based on the identified time and a velocity of propagation of the branched wiring system.

3. A method of claim 1 wherein the step of determining in which branch the short circuit is located comprises comparing the measured high-frequency impedance phase spectrum to a first calculated high-frequency impedance phase spectrum of the branched wiring system having one of the branches short-circuited to identify a correlation.

4. A method of claim 3 further comprising when the measured high-frequency impedance phase spectrum does not correlate to the first calculated high-frequency impedance phase spectrum, comparing the measured high-frequency impedance phase spectrum to additional calculated high-frequency impedance phase spectra of the branched wiring system each having a different one of the branches short-circuited until a correlation is identified.

5. A method of claim 1 further comprising obtaining the calculated high-frequency impedance phase spectrum for the branched wiring system having the one branch short-circuited.

6. A method of claim 1, further comprising obtaining the measured high-frequency impedance phase spectrum.

7. A computer-readable medium containing instructions that cause a data processing system having a program to perform a method for determining the position of a short circuit in a branched wiring system including at least two branches electrically coupled at a node, the method comprising:
   determining the distance from the short circuit to an impedance measurement point based on a measured impedance of the branched wiring system; and
   determining in which branch the short circuit is located by identifying a calculated high-frequency impedance phase spectrum for the branched wiring system with one of the branches short-circuited that correlates to a measured high-frequency impedance phase spectrum for the branched wiring system, wherein the measured high-frequency impedance phase spectrum is measured from the impedance measurement point.

8. A computer-readable medium according to claim 7 wherein the step of determining the distance from the short circuit to the impedance measurement point comprises:
   calculating a signal current based on the measured impedance;
   converting the signal current to the time domain;
   identifying a time at which the signal current exhibits a short-circuit condition; and
   calculating the distance from the short circuit to the impedance measurement point based on the identified time and a velocity of propagation of the branched wiring system.

9. A computer-readable medium of claim 7 wherein the step of determining in which branch the short circuit is located comprises comparing the measured high-frequency impedance phase spectrum to a first calculated high-frequency impedance phase spectrum of the branched wiring system having one of the branches short-circuited to identify a correlation.

10. A computer-readable medium of claim 9 further comprising when the measured high-frequency impedance phase spectrum does not correlate to the first calculated high-frequency impedance phase spectrum, comparing the measured high-frequency impedance phase spectrum to additional calculated high-frequency impedance phase spectra of the branched wiring system each having a different one of the branches short-circuited until a correlation is identified.

11. A computer-readable medium of claim 7 further comprising obtaining the calculated high-frequency impedance phase spectrum for the branched wiring system having the one branch short-circuited.

12. A computer-readable medium of claim 7 further comprising obtaining the measured high-frequency impedance phase spectrum.

13. A data processing system for determining the position of a short circuit in a branched wiring system including at least two branches electrically coupled at a node, the data processing system comprising:
   a memory comprising a program that determines the distance from the short circuit to an impedance measurement point based on a measured impedance of the branched wiring system, and determines in which branch the short circuit is located by identifying a calculated high-frequency impedance phase spectrum for the branched wiring system with one of the branches short-circuited that correlates to a measured high-frequency impedance phase spectrum for the branched wiring system, wherein the measured high-frequency impedance phase spectrum is measured from the impedance measurement point; and
   a processing unit that runs the program.

14. A data processing system of claim 13 wherein the data processing system comprises an impedance measurement device.

15. A data processing system for determining the position of a short circuit in a branched wiring system including at least two branches electrically coupled at a node, the data processing system comprising:
   means for determining the distance from the short circuit to an impedance measurement point based on a measured impedance of the branched wiring system; and
   means for determining in which branch the short circuit is located by identifying a calculated high-frequency impedance phase spectrum for the branched wiring system with one of the branches short-circuited that correlates to a measured high-frequency impedance phase spectrum for the branched wiring system, wherein the measured high-frequency impedance phase spectrum is measured from the impedance measurement point.

* * * * *